United States Patent
Son et al.

(10) Patent No.: US 7,806,742 B2
(45) Date of Patent: Oct. 5, 2010

(54) OPTICALLY TREATED ORGANIC LIGHT EMITTING DEVICE AND METHOD OF MANUFACTURING THE SAME

(75) Inventors: Young-Mok Son, Hwaseong-si (KR); Yu-Jin Kim, Suwon-si (KR); Mu-Gyeom Kim, Hwaseong-si (KR); Jhun-Mo Son, Yongin-si (KR); Sang-Hoon Park, Seongnam-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1140 days.

(21) Appl. No.: 11/472,469

(22) Filed: Jun. 22, 2006

(65) Prior Publication Data
US 2007/0166480 A1    Jul. 19, 2007

(30) Foreign Application Priority Data
Jan. 13, 2006    (KR) .................. 10-2006-0003938

(51) Int. Cl.
*H01J 9/00*    (2006.01)
(52) U.S. Cl. ........................................................ 445/24
(58) Field of Classification Search .............. 445/23–25
See application file for complete search history.

(56) References Cited

U.S. PATENT DOCUMENTS

2004/0119028 A1*  6/2004  McCormick et al. ... 250/492.22

* cited by examiner

*Primary Examiner*—Joseph L Williams
(74) *Attorney, Agent, or Firm*—Robert E. Bushnell, Esq.

(57) ABSTRACT

A method of manufacturing an organic light emitting device, whereby a first electrode is formed on a substrate, at least one organic thin film is formed on the first electrode, the organic thin film is optically treated, and a second electrode is formed on the organic thin film. The method can provide an organic light emitting device with an organic thin film having a stable surface morphology and increased durability.

13 Claims, 5 Drawing Sheets

OPTICALLY TREATED ORGANIC LIGHT EMITTING DEVICE AND METHOD OF MANUFACTURING THE SAME

CROSS-REFERENCE TO RELATED PATENT APPLICATION AND CLAIM OF PRIORITY

This application claims the benefit of Korean Patent Application No. 10-2006-0003938, filed on Jan. 13, 2006, in the Korean Intellectual Property Office, the disclosure of which is incorporated herein in its entirety by reference.

BACKGROUND OF THE INVENTION

1. Field of the Invention

The present invention relates to an optically treated organic light emitting device and a method of manufacturing the same, and more particularly, to an organic light emitting device having a stable surface morphology and an extended lifetime by being optically treated, and a method of manufacturing the same.

2. Description of the Related Art

Light emitting devices are self-emissive devices with the advantages of wide viewing angle, high contrast ratio, and short response time. Types of light emitting devices include inorganic light emitting devices, in which an inorganic compound is included in an emissive layer, and organic light emitting devices in which an organic compound is included in the emissive layer. Organic light emitting devices have superior brightness, low driving voltage, shorter response time, and superior multi-color realization than inorganic light emitting devices. Therefore, many studies have focused on organic light emitting devices.

An organic light emitting device includes a plurality of organic thin films, such as a light emitting layer, a hole injection layer, and a hole transport layer. Conventionally, after the organic thin films are stacked, to stabilize the organic thin films and to remove a solvent remaining in the organic thin films, an electric aging method such as pulse aging or a thermal baking method by which high heat is applied during a manufacturing process is used.

However, an organic light emitting device treated with these methods does not have a satisfactory level of durability and its organic thin films lack a stabilized surface morphology.

SUMMARY OF THE INVENTION

The present invention provides an organic light emitting device having improved durability, and a method of manufacturing the same.

The present invention also provides an organic light emitting device having a stable surface morphology of an organic thin film, and a method of manufacturing the same.

According to an aspect of the present invention, there is provided a method of manufacturing an organic light emitting device, comprising: forming a first electrode on a substrate; forming at least one organic thin film on the first electrode; optically treating the organic thin film; and forming a second electrode on the organic thin film.

The optical treatment of the organic thin film may be performed by projecting a laser beam onto the organic thin film.

The laser beam may be projected directly onto the organic thin film through a beam homogenizer that unifies the energy density distribution around an optical axis and a beam deflector that deflects the laser beam emitted from an ultraviolet ray source or an infrared ray source.

The optical treatment of the organic thin film may be performed under an inert gas atmosphere.

The organic thin film formed between the first electrode and the second electrode may be one layer selected from the group consisting of a hole injection layer, a hole transport layer, and an emissive layer.

The method may further comprise forming at least one layer selected from the group consisting of a hole blocking layer, an electron transport layer, and an electron injection layer, between the first electrode and the second electrode.

It is preferred that the intensity of the laser beam is about 750 mJ/cm$^2$.

The optical treatment of the organic thin film may be performed multiple times.

According to another aspect of the present invention, there is provided a method of manufacturing an organic light emitting device, comprising: forming a first electrode on a substrate; forming at least an organic thin film on the substrate; forming a second electrode on the organic thin film; and optically treating the organic thin film.

The optical treatment of the organic thin film may be performed by a method of manufacturing an organic light emitting device according to other embodiments of the present invention, except that the laser beam is projected from the substrate side instead of being projected directly onto the organic thin film.

The organic thin film formed between the first electrode and the second electrode may be one layer selected from the group consisting of a hole injection layer, a hole transport layer, and an emissive layer.

The method may further comprise forming at least a layer selected from the group consisting of a hole blocking layer, an electron transport layer, and an electron injection layer, between the first electrode and the second electrode.

According to still another aspect of the present invention, there is provided a method of manufacturing an organic light emitting device, comprising: forming a first electrode on a substrate; forming at least one organic thin film on the substrate; forming a second electrode on the organic thin film; and rearranging a molecular chain of the organic thin film to stabilize a surface morphology of the organic thin film.

The rearrangement of the molecular chain is performed by optically treating the organic thin film. The optical treatment of the organic thin film is performed by projecting a laser beam onto the organic thin film.

The rearrangement of the molecular chain is performed before or after the second electrode is formed.

According to yet another aspect of the present invention, there is provided a method of manufacturing an organic light emitting device, comprising: forming a first electrode on a substrate; forming at least one organic thin film on the first electrode; forming a second electrode on the organic thin film; and projecting a laser beam onto the organic thin film to stabilize the organic thin film before or after the second electrode is formed.

It is preferred that, before the projection of the laser beam, the optical thin film formed on the first electrode is dried and placed under an inert gas atmosphere.

According to another aspect of the present invention, there is provided an organic light emitting device manufactured according to the method of manufacturing an organic light emitting device.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown.

An organic thin film of an organic light emitting device at an initial stage has an unstable molecular chain structure due to various limitations of its manufacturing process, such as rapid cooling to remove a solvent after forming the thin film. The stabilizing of the molecular chains in the organic thin film by rearranging the molecular chains may make the organic thin film strong and its surface roughness reduced. The increase of the stability of an organic thin film and the stabilization of the surface morphology may be achieved by increasing the temperature of the organic thin film so that the molecular chain can freely move due to the received thermal energy. The increase of the temperature of the organic thin film may be performed by providing photon energy to the organic thin film, whereby the organic thin film may generate molecular vibration by absorbing the photon energy so that this rapidly increases the temperature of the organic thin film.

Figure 1:
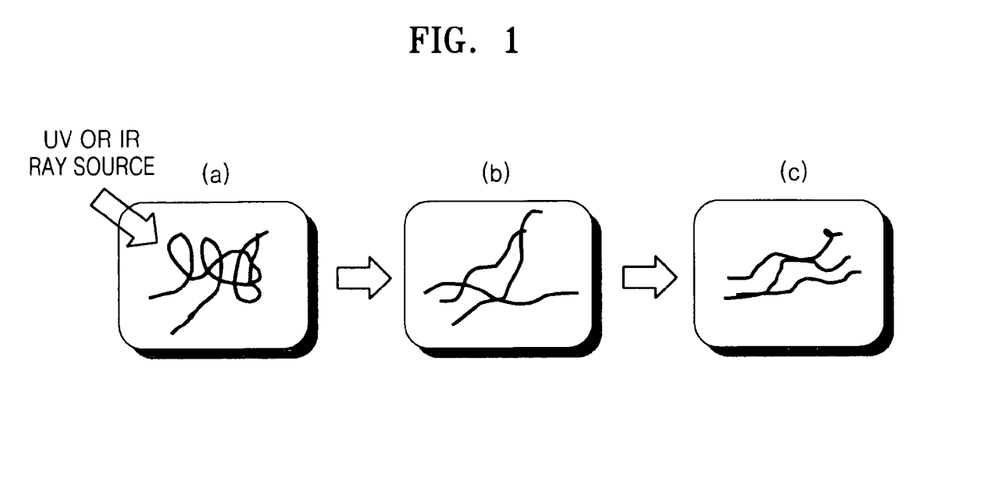
FIG. 1 is a conceptual drawing for explaining the principle of stabilization of an organic thin film of an organic light emitting device through an optical treatment.
Figure 2A:
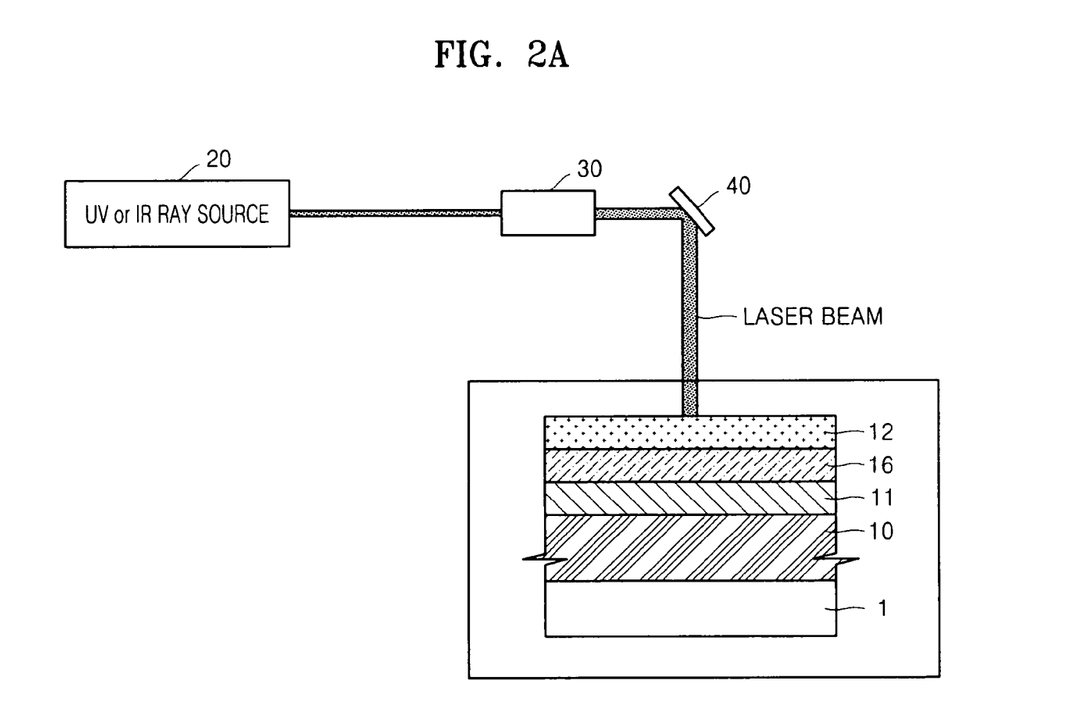
FIGS. 2A and 2B are schematic drawings showing the process of manufacturing an organic light emitting device according to an embodiment of the present invention.
Figure 2B:
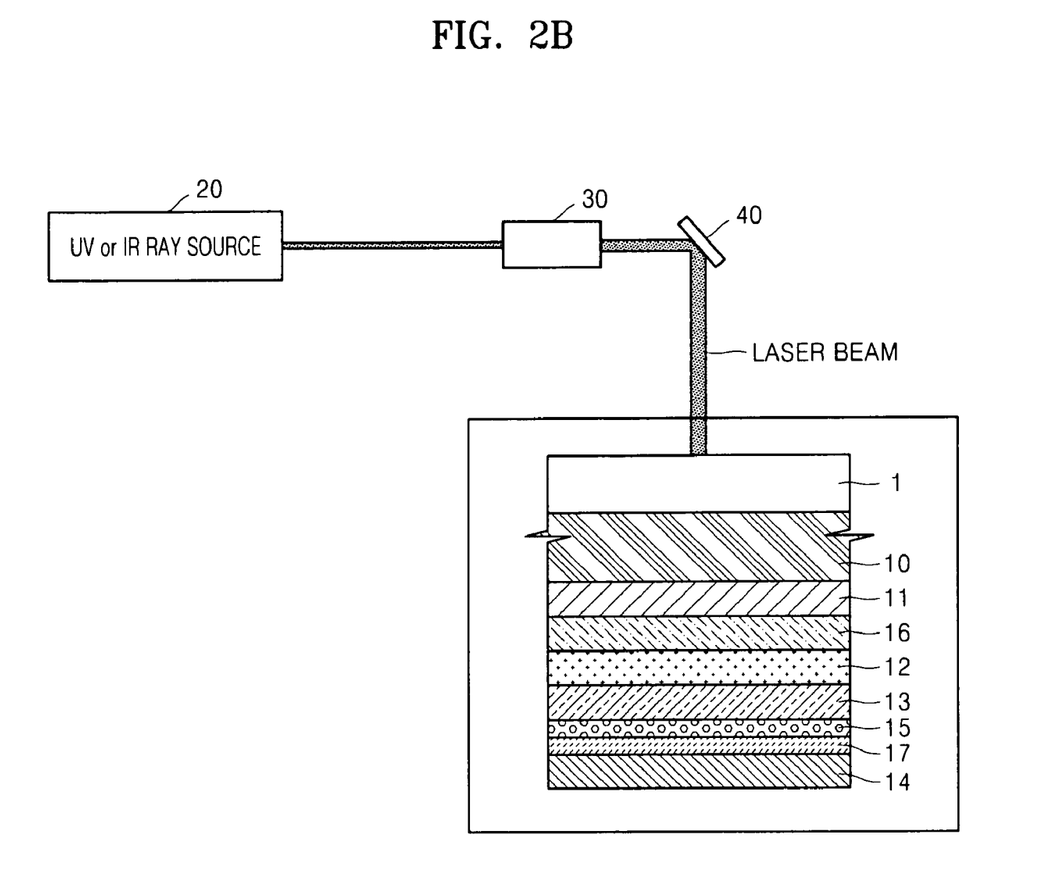

FIG. 1 is a conceptual drawing for explaining the principle of stabilization of an organic thin film of an organic light emitting device through an optical treatment, and FIGS. 2A and 2B are schematic drawings showing the process of manufacturing an organic light emitting device according to an embodiment of the present invention.

Referring to FIGS. 2A and 2B, a method of manufacturing an organic light emitting device according to an embodiment of the present invention includes: forming a first electrode 10 on a substrate 1; forming at least an organic thin film on the first electrode 10; optically treating the organic thin film; and forming a second electrode 14 on the organic thin film.

These operations will now be described in detail.

First, the patterned first electrode 10 is formed on the substrate 1. Here, the substrate 1 is a typical substrate used for organic light emitting devices, and may be a glass substrate or a plastic substrate having high transparency, surface planarity, easy workability, and high water-proofness. The substrate 1 may have a thickness of 0.3 to 1.1 mm. The material for forming the first electrode 10 has no specific limitations. If the first electrode 10 is an anode, the anode is formed of a conductive metal or an oxide thereof into which holes can be easily injected, for example, indium tin oxide (ITO), indium zinc oxide (IZO), Ni, Pt, Au, and/or Ir.

Next, the substrate 1 having the first electrode 10 is washed, and UV/ozone treatment is performed. At this time, the washing solution can be an organic solvent such as isopropanol (IPA), acetone, etc.

Next, a hole injection layer 11 is selectively formed on the first electrode 10 of the washed substrate 1. When the hole injection layer 11 is formed, the contact resistance between the first electrode 10 and an emissive layer 12 which will be described later, is reduced, and at the same time, the hole transport capability of the first electrode 10 with respect to the emissive layer 12 is improved. As a result, the driving voltage and lifetime of the device can be improved. The hole injection layer 11 can be formed of a typical material, for example, poly(3,4-ethylenedioxythiophene) (PEDOT)/polystyrene para-sulfonate (PSS), a starburst material, copper phthalocyanine, polythiophene, polyaniline, polyacetylene, polypyrrole, polyphenylene vinylene, or a derivative of these materials. After at least one of the materials is coated on the first electrode 10 by spin coating, the hole injection layer 11 is formed by drying. The hole injection layer 11 is formed to a thickness of 300 to 2000 Å, and more preferably, 500 to 1100 Å. If the hole injection layer 11 has a thickness out of this range, the hole injection characteristics deteriorate. The drying temperature may be 100 to 250° C.

Next, a hole transport layer 16 is selectively formed on the hole injection layer 11. The hole transport layer 16 can be formed of any material that can satisfy hole transportation, for example, polytriphenylamine. The hole transport layer 16 may have a thickness of 100 to 1000 Å.

Next, the emissive layer 12 is formed by coating a composition for forming the emissive layer 12 and drying it on the hole transport layer 16, using spin coating. The emissive layer 12 can be formed of a polymer organic material such as poly-phenylene vinylene (PPV) or polyfluorene by screen printing or ink jet printing.

If necessary, a dopant can further be included in the material for forming the emissive layer 12. In this case, the content of the dopant may vary according to the material, but is generally between 30 to 80 parts by weight per 100 parts by weight of the material for forming the emissive layer 12. If the content of the dopant is out of this range, the emission characteristics of the organic light emitting device may be reduced. The dopant can be an aryl amine compound, a peryl compound, a pyrrol compound, a hydrazone compound, a carbazole compound, a stilbene compound, a starburst compound, or an oxadiazole compound. The thickness of the emissive layer 12 may be controlled to the range of 100 to 1000 Å, and more preferably, 500 to 1000 Å, by controlling the content of the material for forming emissive layer 12 and the spinning speed of a spin coater. If the emissive layer 12 has a thickness of less than 100 Å, emission efficiency is reduced, and if the thickness exceeds 1000 Å, the driving voltage is increased.

Since the hole injection layer 11, the hole transport layer 16, and the emissive layer 12 include an organic compound, they are customarily called organic thin films.

Next, when all or a portion of the organic thin films are formed on the substrate 1 where the first electrode 10 is formed, the organic thin films are optically treated by projecting a laser beam onto the organic thin films.

Referring to FIG. 2A, prior to optical treatment, the resultant product is dried and placed under an inert gas atmosphere such as nitrogen or helium to avoid a chemical reaction. Next, when a laser beam is irradiated from an ultraviolet ray source or an infrared ray source, the laser beam passes through a beam homogenizer 30. The beam homogenizer 30 unifies the energy density distribution around the optical axis of the laser beam and reduces the intensity of the laser beam. Next, the laser beam is directly projected onto the organic thin film through a beam deflector 40 that deflects the laser beam to be projected. Here, the direct projection of the laser beam means that it is projected from above the organic thin film when no other layer is stacked on the organic thin film. Accordingly, FIG. 2A shows an optical treatment of the organic thin film during the manufacture of an organic light emitting device.

The optical treatment increases the stability of the organic thin film leading to a stabilized surface morphology, and also improves the durability of an organic light emitting device that includes the organic thin film. The mechanism of increasing the stability of an organic thin film and stabilizing the surface morphology through the optical treatment will now be described with reference to FIG. 1.

Referring to FIG. 1(*a*), an organic thin film at an initial stage has an unstable molecular chain structure due to various limitations of its manufacturing process, such as rapid cooling to remove a solvent after forming the thin film.

Afterward, when a laser beam is projected onto the organic thin film, the organic thin film generates molecular vibration by absorbing photon energy. This rapidly increases the temperature of the organic thin film, and as depicted in FIG. 1(*b*), the original structure is demolished since the molecular chain can freely move due to the received thermal energy.

Next, when the organic thin film is slowly cooled down to room temperature after a period of time, as depicted in FIG. 1(*c*), the molecular chain is rearranged to a stable state. Here, the re-arrangement of the molecular chain to a stable state denotes that the structural arrangement of the molecular chain is rearranged to a form which is not easily changed by thermal or physical impact. In this way, the molecular chains are stuck with each other in an arranged state instead of being entangled with each other. Accordingly, the organic thin film becomes strong and surface roughness is reduced, thereby stabilizing the surface morphology.

The optical treatment of the organic thin film is not sequentially specified in the manufacturing process. That is, the optical treatment of the organic thin film can be performed several times in each manufacturing process. FIG. 2B shows an embodiment of performing an optical treatment of an organic thin film after the organic thin film is manufactured.

The embodiment in FIG. 2B differs from the embodiment in FIG. 2A in that the manufacture of an organic light emitting device is first completed, and second, a laser beam is projected onto the organic thin film through the substrate 1, since the organic light emitting device is upside down.

Next, a hole blocking layer 13 and/or an electron transport layer 15 are formed on the emissive layer 12 by deposition or spin coating. The hole blocking layer 13 blocks the mobilization of excitons formed in an emission material to the electron transport layer 15, or blocks the mobilization of holes to the electron transport layer 15.

The hole blocking layer 13 can be formed of LiF or MgF$_2$, phenanthrolines {BCP (UDC Co.)}, imidazoles, oxadiazoles (for example, PBD), triazoles, aluminum complex (UDC Co.), or BAlq, having the following chemical structures.

Organic compound containing phenanthroline

Organic compound containing imidazole

Organic cpompound containing triazole

Organic cpompound containing oxadiazole

BAlq

The electron transport layer 15 can be formed of oxazoles, isooxazoles, triazoles, isothiazoles, oxadiazoles, thiadiazoles, perylenes, aluminum complex (e.g. Alq3 (tris(8-quinolinolato)-aluminium), BAlq (aluminum(III)bis(2-methyl-8-quinolinato).sub.4-phenylphenolate), SAlq (bis(2-methyl-8-quinolato)-(triphenylsiloxy)aluminium(III), Almq3 (tris(8-hydroxyquinolate)aluminum), etc.), gallium complex (e.g. Gaq'2OPiv, Gaq'2OAc, 2(Gaq'2), etc. or their derivatives having the following chemical structures.

Perylene compound derivative

Alq3

BAlq

SAlq

Almq3

Gaq'2OPiv

Gaq'2OAc

2(Gaq'2)

The hole blocking layer 13 may have a thickness of 50 to 1000 Å, and the electron transport layer 15 may have a thickness of 100 to 1000 Å. If the thicknesses of the hole blocking layer 13 and the electron transport layer 15 exceed the above ranges, the electron transportation capability and hole blocking capability can be reduced.

Next, an electron injection layer (EIL) 17 that facilitates electron injection from a cathode can be selectively stacked on the electron transport layer 15. The material for forming the EIL 17 is not specifically limited.

The EIL 17 can be formed of a material commonly used for forming an EIL, such as LiF, NaCl, CsF, Li2O, BaO, etc. The deposition conditions of the EIL 17 vary according to the compounds used, but are generally equivalent to those for forming the hole injection layer 11.

The EIL 17 may have a thickness of 1 to 100 Å, and more preferably, 5 to 50 Å. If the thickness of the EIL 17 is less than 1 Å, the electron injection characteristics are reduced, and if it exceeds 100 Å, the driving voltage can be increased.

Next, a second electrode 14 is formed on the resultant product, and the resultant product is sealed to complete the manufacture of the organic light emitting device.

The material for forming the second electrode 14 is not specifically limited, but is a metal having a low work function, such as Li, Ca, Ca/Al, LiF/Ca, LiF/Al, Al, Mg, Mg alloy. The second electrode 14 may have a thickness of 50 to 3000 Å.

The manufacture of an organic light emitting device according to the present invention does not require specific equipment or methods, but can be manufactured according to a method of manufacturing an organic light emitting device that uses a typical light emitting polymer.

An embodiment of the present invention will now be described, but the present invention is not limited thereto.

Embodiment

Manufacturing an Organic Light Emitting Device

A specimen of an organic light emitting device included a substrate 1, a first electrode 10, a hole injection layer 11, a emissive layer 12, and a second electrode 14, stacked in sequence. The substrate was formed of glass, the first electrode 10 was formed of ITO, the hole injection layer 11 was formed of PEDOT, the emissive layer 12 was formed of poly(spiro bifluorene-co-phenoxazine), which is a kind of polyfluorene, and the second electrode 14 was formed of $BaF_2$/Ca/Al. Four identical organic light emitting device specimens were prepared. Organic thin film portions of the organic light emitting device specimens were optically treated before completing the manufacture of the organic light emitting device.

Optical Treatment of the Organic Thin Film

The organic thin film, that is, the hole injection layer 11 and the emissive layer 12, was optically treated using the method depicted in FIG. 2A.

After forming the substrate 1, the first electrode 10, the hole injection layer 11, and the emissive layer 12, a laser beam was projected from above the emissive layer 12. Different laser beam intensities were used for each of the four uncompleted organic light emitting device specimens. The intensities of the laser beams projected onto each specimen are shown in FIG. 3B. In the case of the comparative embodiment, no laser beam was used.

Effect of Optical Treatment (Test Method)

To examine the effect of the optical treatment, a durability test was performed on each optically treated organic light emitting device specimen. The durability test measured the half life of the organic light emitting device, that is, the time taken for the intensity of the light emitted by the organic light emitting device to drop to 50% of its initial intensity.

Next, the surface morphology of the organic thin film of each optically treated organic light emitting device was examined by scanning the surface of the organic thin film using an AFM.

(Test Result—half Life/durability)

Figure 3A:
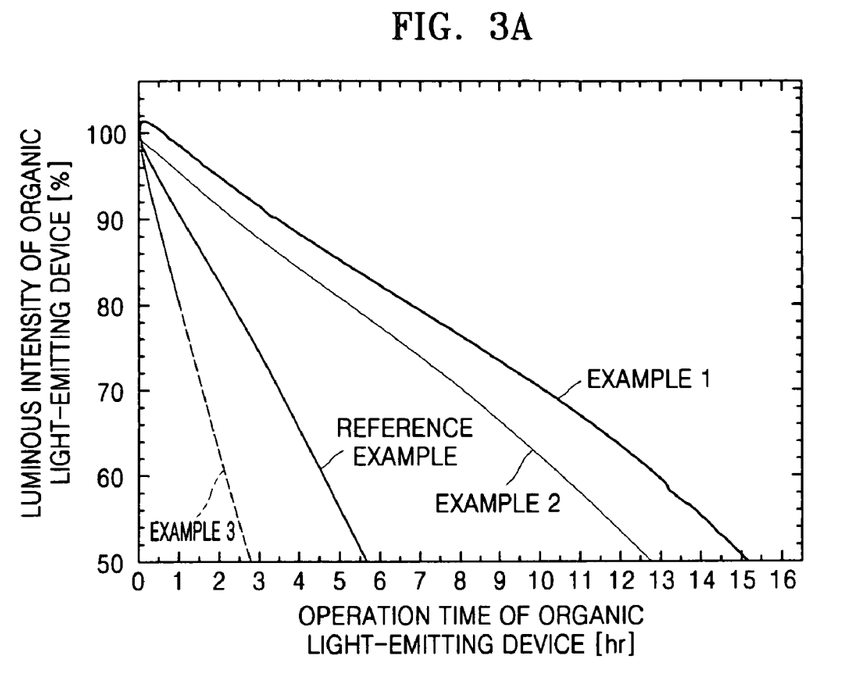
FIGS. 3A and 3B are graphs showing the half-lives of organic light emitting devices according to embodiments of the present invention and conventional organic light emitting devices.
Figure 3B:
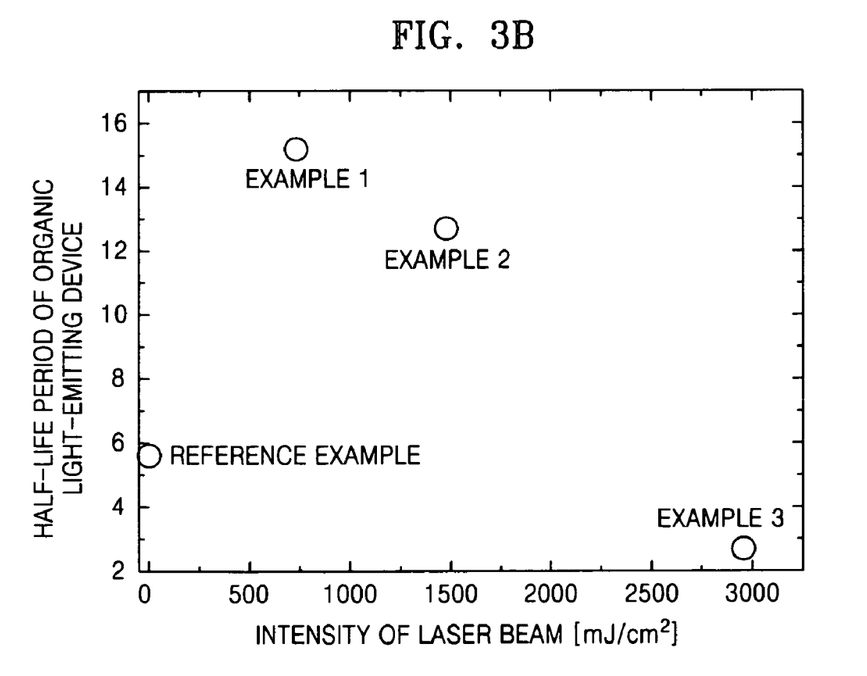

FIGS. 3A and 3B are graphs showing the half-lives of organic light emitting devices according to embodiments of the present invention and conventional organic light emitting devices.

FIG. 3A is a graph showing the half life, that is, the time required for reducing the intensity of light emitted from the organic light emitting device from 100% to 50% of the initial intensity, and FIG. 3B is a graph showing the half life with respect to the intensity of the laser beam used to treat the organic light emitting device.

Referring to FIGS. 3A and 3B, the intensity of the laser beam, from lowest to highest, was in the order of comparative example (optically untreated)<embodiment 1 (750 mJ/$cm^2$)<embodiment 2 (1490 mJ/$cm^2$)<embodiment 3 (2950 mJ/$cm^2$). However, the half life was in the order of embodiment 3<comparative example (optically untreated)<embodiment 2<embodiment 1. This result shows that there is an optimum intensity of laser beam that increases the durability of an organic light emitting device. The comparative example had a half life of approximately 5.6 hours, but embodiment 3, which had the strongest laser beam intensity, had a half life of approximately 2.7 hours. That is, embodiment 3 had a lower durability than the comparative example. Embodiments 1 and 2 had half lives of 12.6 hours and 15.2 hours respectively, giving significantly higher durability. However, embodiment 1 had a weaker laser beam but a longer half life than embodiment 2. Accordingly, in the present embodiment, embodiment 1 is closer to the optimum. This result confirms that the durability of an organic light emitting device can be more than doubled by optically treating the organic thin film.

(Test Result—surface Morphology)

FIGS. 4A through 4D are AFM images of the surface morphology of organic thin films included in organic light emitting devices according to embodiments of the present invention and conventional organic light emitting devices.

Figure 4A:
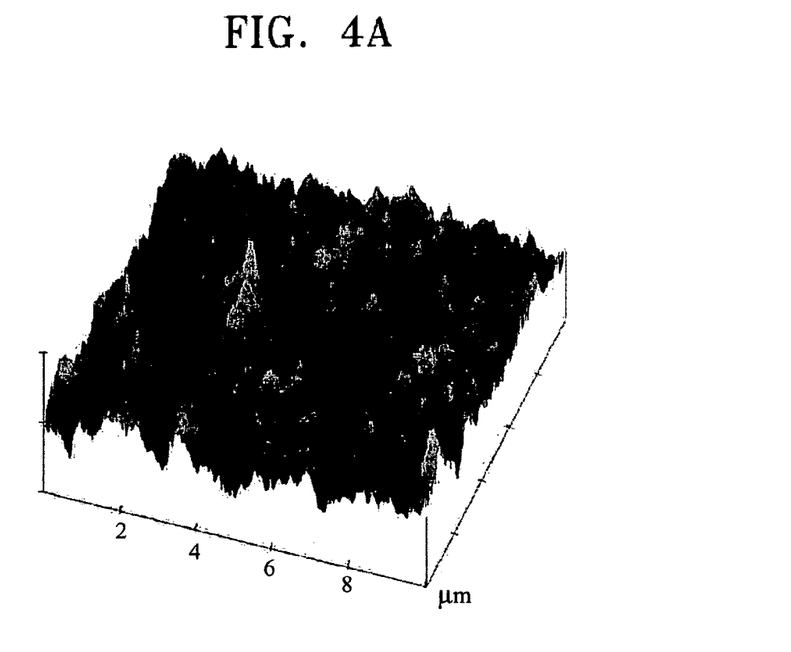
FIGS. 4A through 4D are atomic force microscope (AFM) images of the surface morphology of organic thin films included in organic light emitting devices according to embodiments of the present invention and conventional organic light emitting devices.
Figure 4B:
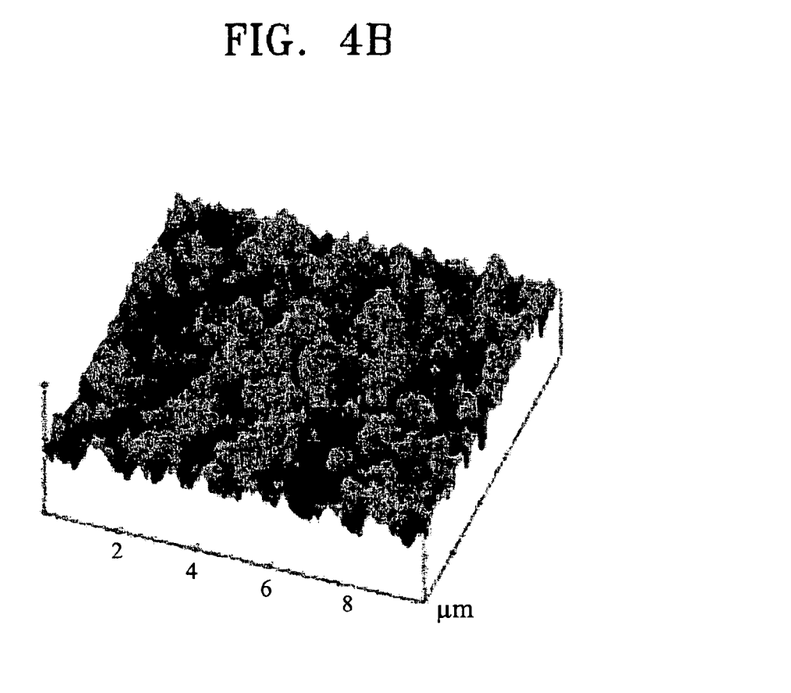
Figure 4C:
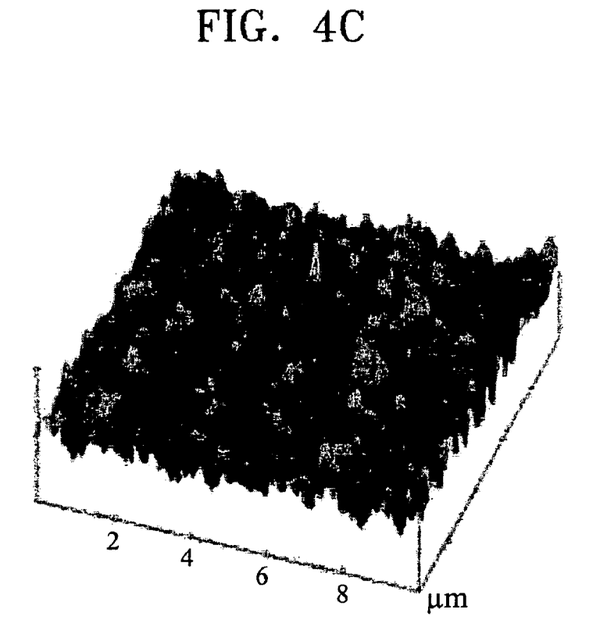
Figure 4D:
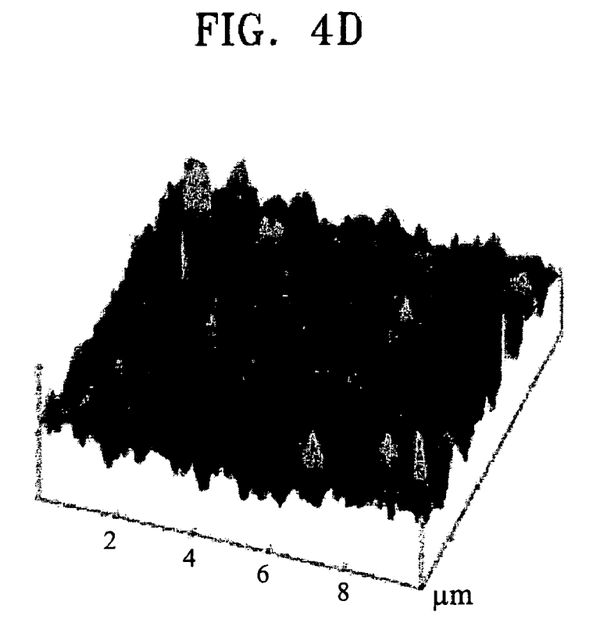

FIG. 4A is a comparative example, FIG. 4B is an embodiment 1, FIG. 4C is an embodiment 2, and FIG. 4D is an embodiment 3. Measurement results of the surface roughness of an organic thin film of an organic light emitting device are summarized in Table 1.

TABLE 1

| Organic light emitting device specimen | Surface roughness (RMS: Root mean square), nm |
|---|---|
| Comparative example | 1.380 |
| Embodiment 1 | 1.239 |
| Embodiment 2 | 1.275 |
| Embodiment 3 | 1.439 |

Referring to FIGS. 4A through 4D, the magnitude of the surface roughness, from lowest to highest, was in the order of embodiment 1<embodiment 2<comparative example<embodiment 3. That is, surface roughness and durability have a similar trend, where high durability accompanies low surface roughness.

According to the present invention, an organic light emitting device having increased durability and a method of manufacturing the organic light emitting device are provided.

Also, according to the present invention, an organic light emitting device having a stable surface morphology and a method of manufacturing the organic light emitting device are provided.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of manufacturing an organic light emitting device, comprising:
    forming a first electrode on a substrate;
    forming at least one organic thin film on the first electrode;
    optically treating the organic thin film by projecting a laser beam directly onto the organic thin film; and
    forming a second electrode on the organic thin film.

2. The method of claim 1, wherein the laser beam is projected directly onto the organic thin film through a beam homogenizer that unifies the energy density distribution around an optical axis and a beam deflector that deflects the laser beam emitted from an ultraviolet ray source or an infrared ray source.

3. The method of claim 1, wherein the optical treatment of the organic thin film is performed under an inert gas atmosphere.

4. The method of claim 1, wherein the organic thin film formed between the first electrode and the second electrode is one layer selected from the group consisting of a hole injection layer, a hole transport layer, and an emissive layer.

5. The method of claim 1, further comprising forming at least one layer selected from the group consisting of a hole blocking layer, an electron transport layer, and an electron injection layer, between the first electrode and the second electrode.

6. The method of claim 1, wherein an intensity of the laser beam is about 750 $mJ/cm^2$.

7. The method of claim 1, wherein the optical treatment of the organic thin film is performed multiple times.

8. A method of manufacturing an organic light emitting device, comprising:
    forming a first electrode on a substrate;
    forming at least one organic thin film on the substrate;
    forming a second electrode on the organic thin film; and
    rearranging a molecular chain of a whole area of the organic thin film to stabilize a surface morphology of the organic thin film.

9. The method of claim 8, wherein the rearrangement of the molecular chain is performed by optically treating the organic thin film.

10. The method of claim 9, wherein the optical treatment of the organic thin film is performed by projecting a laser beam onto the organic thin film.

11. The method of claim 10, further comprising, before the projection of the laser beam, drying the organic thin film formed on the first electrode and placing the organic thin film formed on the first electrode under an inert gas atmosphere.

12. The method of claim 8, wherein the rearrangement of the molecular chain is performed before the second electrode is formed.

13. The method of claim 8, wherein the rearrangement of the molecular chain is performed after the second electrode is formed.

* * * * *